United States Patent
Nakagawa et al.

(10) Patent No.: US 6,356,451 B1
(45) Date of Patent: Mar. 12, 2002

(54) MULTI-LAYERED SUBSTRATE, METHOD FOR MANUFACTURING THE MULTI-LAYERED SUBSTRATE AND ELECTRIC APPARATUS

(75) Inventors: Yasutada Nakagawa, Yokohama; Nobuko Nakamura, Fujisawa; Yasuo Fujii, Tokyo, all of (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/231,764

(22) Filed: Jan. 15, 1999

(30) Foreign Application Priority Data

Jan. 19, 1998 (JP) .............................. 10-007716
Aug. 12, 1998 (JP) .............................. 10-228060
Aug. 31, 1998 (JP) .............................. 10-244558

(51) Int. Cl.$^7$ ................................. H05K 7/02
(52) U.S. Cl. ................ 361/760; 361/792; 361/795; 361/794; 361/780; 361/777; 174/255; 174/250; 174/253; 174/261; 174/257; 29/830; 29/846; 29/831; 29/829; 428/209; 428/210; 428/213; 428/212; 428/901
(58) Field of Search ................ 361/752, 792, 361/795, 794, 780, 777, 760; 174/255, 250, 253, 261, 257; 29/830, 846, 831, 829; 428/209, 201, 901, 213, 212

(56) References Cited

U.S. PATENT DOCUMENTS

| 5,004,640 A | * | 4/1991 | Nakatani et al. ............ 428/195 |
| 5,041,699 A | | 8/1991 | Soliday |
| 5,396,397 A | * | 3/1995 | McClanahan et al. ...... 361/313 |
| 5,876,789 A | * | 3/1999 | Nakada ........................ 427/96 |
| 6,143,116 A | * | 11/2000 | Hayashi et al. ............. 156/233 |

FOREIGN PATENT DOCUMENTS

JP 8-51258 2/1996

* cited by examiner

Primary Examiner—Jeffrey Gaffin
Assistant Examiner—Thanh Yen Tran
(74) Attorney, Agent, or Firm—Oblon, Spivak, McClelland, Maier & Neustadt, P.C.

(57) ABSTRACT

Conductive layers have at least a portion of a conductive member arranged in a nonlinear or polygonal configuration and having a greater layout area and an insulating layer is alternately stacked relative to the conductive layer, wherein a variation in amount of the conductive member at the conductive layer with a middle of a board thickness direction as a reference is set in a range in which a warp is less likely to be produced and in a range near to zero.

19 Claims, 5 Drawing Sheets

COPPER PATTERN OF $L_1$
(COPPER AREA: 60%)

FIG. 2B

COPPER PATTERN OF $L_6$
(COPPER AREA: 60%)

COPPER PATTERN OF $L_1$
(COPPER AREA:20%)

FIG. 3B

COPPER PATTERN OF $L_6$
(COPPER AREA:80%)

MULTI-LAYERED SUBSTRATE, METHOD FOR MANUFACTURING THE MULTI-LAYERED SUBSTRATE AND ELECTRIC APPARATUS

BACKGROUND OF THE INVENTION

The present invention relates to an interconnection board, in particular, a multi-layered printed circuit board, so treated as to prevent a warp occurring due to heat evolved in a refolding furnace and a method for manufacturing the same, and further to an electric apparatus, in particular, a portable compact electric apparatus, manufactured using such a interconnection board.

A conduction pattern of an interconnection board with electronic components mounted thereon is pattern-designed based on a product configuration and electric circuit design. According to the conduction pattern, a copper-clad laminate plate is subjected to, for example, a subtractive process whereby those unrequired portions of a copper foil on the laminate place are dissolved/removed with chemicals to obtain a necessary conduction pattern on the laminate plate.

In order to mount electric components on the resultant interconnection board and, by doing so, manufacture a circuit board, soldering is performed on the components. In the case where extensively used chip components are to be mounted on the electronic apparatus, use has usually been made of a reflow soldering.

The reflow soldering has been done by conveying a circuit board 14 with electronic components 13 mounted thereon on a conveying belt (12a, 12b) and into a reflow furnace 10 as shown in FIG. 7. First, a cream solder is coated onto pads on an interconnection board 1 and then terminal sections of the electronic components 15, such as chip components, are accurately positioned and mounted on the pads on an electronic conduction layer of the printed circuit board 15. And they are passed, with this state maintained, through the reflow furnace 10, such as an infrared furnace or hot air furnace, to cause the cream solder to be melted. After soldering has been so achieved, the resultant components 13 are fixed in a predetermined position.

Figure 7A:
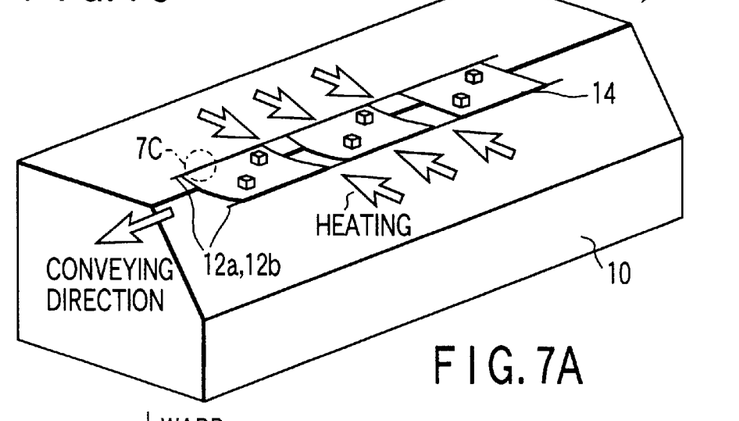
FIG. 7A is an explanatory view diagrammatically showing a step done in a refolding furnace.
Figure 7B:
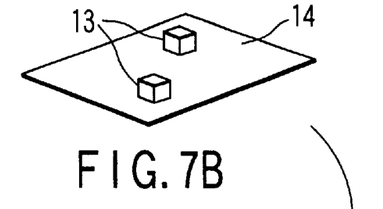
FIG. 7B is a perspective view showing a major area of electronic components mounted one the circuit board.
Figure 7C:
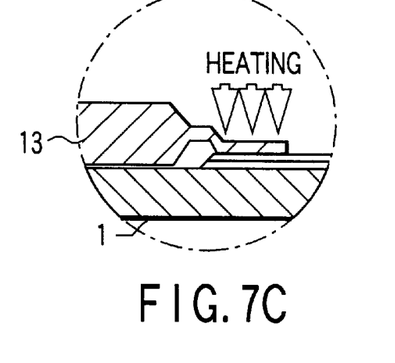
FIG. 7C is a cross-sectional view showing a major area of electronic component's terminal portion and the circuit board in a heating step.
Figure 7D:
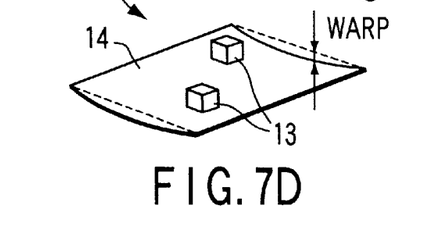
FIG. 7D is a perspective view showing the circuit board after the heating step.

Since a high temperature is prevalent in the reflow furnace, an insulating material of the interconnection board 1 is softened or hardened to create a warp at the interconnection board 1. A deformation caused by such a warp in the reflow furnace 10 remains at the interconnection board even if the board is conveyed out of the furnace.

In a state of the interconnection board, etc., with electronic components not yet mounted thereon, a warp occurs at a thus manufactured circuit board and normally a time at which the manufacture of the board has been completed, except in the case of a flexible interconnection board, and there is more warp at the circuit board after soldering has been done at the reflow furnace where electronic components are mounted.

There is a risk that the warp at the interconnection board will cause a solder connection failure between the semiconductor leads mounted and the interconnection layers. The solder connection failure, if occurring, requires a manual connection operation and more manual steps of operation. Depending upon the cases involved, there may occur a stop in a line of production due to a drop of any warped interconnection board from a mounting device.

In accordance with the need for a more lightweight product, the circuit board becomes thinner and there is a strong tendency that more warp occurs in the mounting process of the electronic components on a thinner printed circuit board. And a higher percentage of faults occurs at the printed circuit board due to the warp at the thinner board. For this reason, an excessive amount of warp occurs, thus failing to allow the use of an automatic assembling apparatus upon the mounting of the electronic components at a subsequent step. This involves the cases where the components cannot be accurately mounted on the board.

Figure 8:
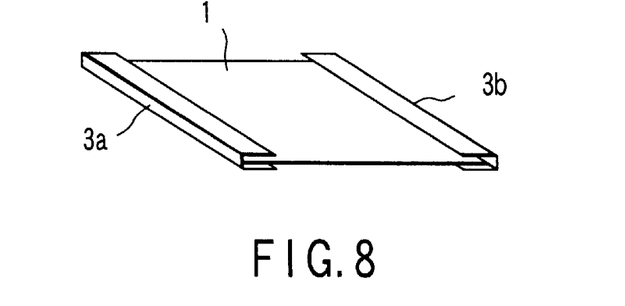
FIG. 8 is a diagrammatic view showing an example of using a warp preventing fixture for the board.

There are sometimes the cases where a warp preventing jig may also be used as shown in FIG. 8 so as to prevent a warp in the reflow process. This jig is such as to provide a warp preventing fixture (3a, 3b) on both sides of a printed interconnection board 1 in a conveying direction in the reflow furnace or to provide a warp preventing bar, not shown, on the printed interconnection board 1.

If the jig is used, it is difficult to provide an automatic mounting of the jig. In this case, an operator's manual operation is required at a mounting time. Even from the standpoint of costs, it is not desirable that the use of the warp preventing fixture involve an added manufacturing cost. More steps are undesirably required even in the case where the warp preventing bar is mounted as set out above.

BRIEF SUMMARY OF THE INVENTION

An object of the present invention is to provide an interconnection board so designed as to have a balanced conductive pattern between respective layers in a conductive board and, by doing so, obtain a circuit board less likely to be warped even under an influence from heat in a reflow furnace, etc., and to provide an electric apparatus using a board less likely to be warped under a heat deformation.

In order to achieve the object of the present invention, conductive layers have at least a portion of a conductive member arranged in a nonlinear or polygonal configuration and having a greater layout area and an insulating layer is alternately stacked relative to the conductive layer, wherein a variation in amount of the conductive member at the conductive layer with a middle of a board thickness direction as a reference is set in a range in which a warp is less likely to be produced and in a range near to zero.

According to the present invention, in order to reduce a variation in amount of copper in a thickness direction of conductive layers in an interconnection board, the copper occupation rate of the conductive layer and thickness of the insulating layer are adjusted. By reducing the bending moment resulting from a heat deformation it is possible to prevent a warp of the interconnection board and to achieve less warp. It is possible to apply the present invention to a compact electric apparatus hard to achieve heat control and to contribute much to achieving a compact unit since it is not necessary to use other heat control component parts.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

An embodiment of the present invention will be explained below with reference to the accompanying drawing.

A printed circuit board is prepared having a conduction pattern on a multi-layered printed circuit board with a conduction pattern layer formed on each surface of its respective insulating layer. As such a multi-layered circuit board having a plurality of such conductive layers, a four-layered board (that is, a board of four conductive pattern layers)-, a six-layered board-, an eight-layered board, or more-layered board type (such as a 44-layered type) have been achieved on practical forms with a recent tendency toward a compact and high-density electronic apparatus.

The respective conduction layers of these multi-layered printed circuit board have their conductive pattern designed based on a predetermined circuit, while considering a restriction to a mounting space based on respective product shape, a heat dissipation efficiency, etc., of mounted components. Since, in this case, a preference is normally given to an electric circuit design, product configuration design, no warp prevention design is carried out so as to prevent a warp from occurring after a printed circuit board with predetermined electronic components mounted thereon has been passed through the reflow furnace. For this reason, no consideration is normally paid to the cross-section of the multi-layered printed circuit board and mutual relation of the pattern at each conductive layer in conjunction with warp involved. As a result, the multi-layered printed circuit board assists an increase in a warp over its full length.

The warping of the printed circuit board in the reflow furnace is caused by stresses resulting from a difference in thermal expansion coefficient between the respective insulating layer and the respective conductive layer in the printed circuit board and difference in thermal expansion coefficient between the surface side and the rear surface side of the board. This is prominently produced in a board, in particular, for a lightweight, thin compact electronic apparatus such as a hand-held telephone set.

In the multi-layered printed circuit board, if a procedure is taken to arrange those conductive layers relative to a middle layer in a symmetrically balanced relation to a gravity position, then it is possible to prevent a warp through the canceling of their stresses. The mutual balance of the conductive layers is obtained by properly setting those copper areas with respect to the board and their arrangement.

Figure 1:
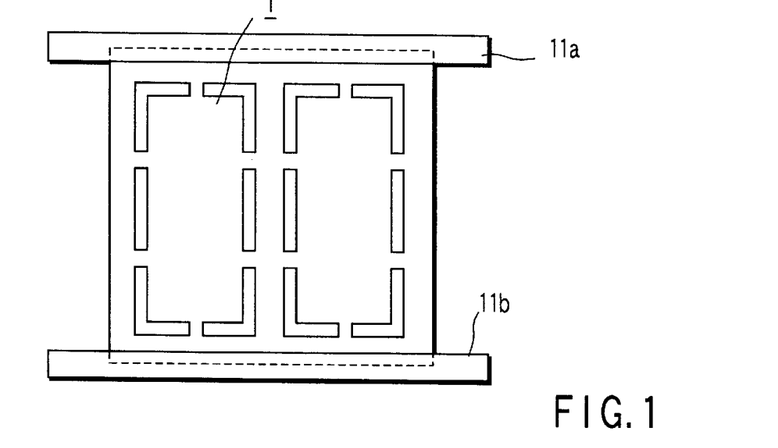
FIG. 1 is a plan view showing a state in which an interconnection board according to one embodiment of the present invention is conveyed on a conveyor belt in a reflow furnace.
Figure 2A:
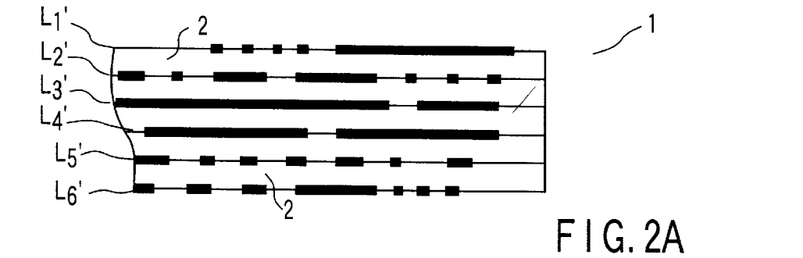
FIG. 2A is a view in which a balanced process is done on a board copper foil layer in the interconnection board, a cross-sectional view as cut off along I—I line in FIG. 2B.
Figure 2B:
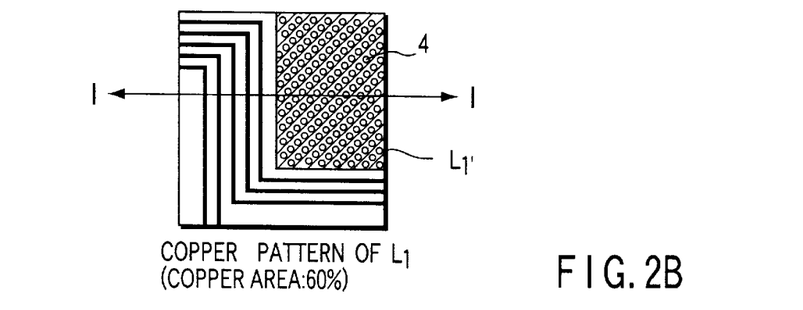
FIG. 2B is a plan view showing a conductive pattern on the interconnection board.
Figure 2C:
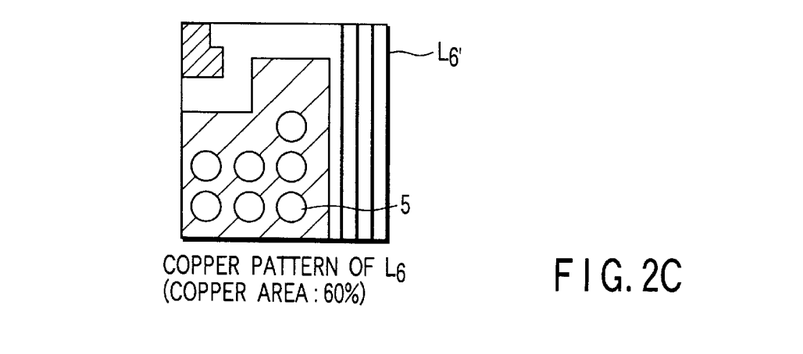
FIG. 2C is a plan view showing a conductive pattern of a given conductive layer in a symmetric position relative to FIG. 2B in a thickness direction of the interconnection board.
Figure 3A:
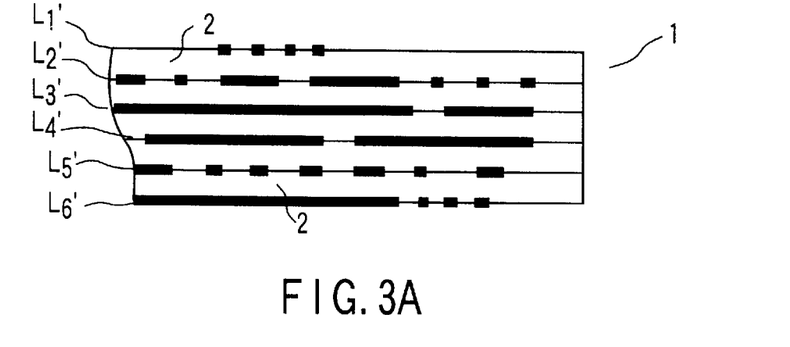
FIG. 3A is a view showing a state previous to performing balanced processing on a board copper foil layer of the interconnection board, a cross-sectional view as cut away along line II—II in FIG. 3B.

FIG. 1 a plan view showing the conveying of the multi-layered printed circuit board on the conveyor belt means in the reflow furnace and FIGS. 2A to 2C show copper foil layers subjected to balance processing, FIG. 2A being a cross-sectional view, taken along line I—I, showing the multi-layered printed circuit board of FIG. 2B. FIGS. 2B and 2C are plan views showing a mutual conductive pattern of the conductive layers in the symmetric position in a thickness direction of the multi-layered printed circuit board. FIG. 3 shows copper foil layers before being balance-processed, FIG. 3A being a cross-sectional view, taken along line II—II. Further, FIGS. 3B and 3C are plan and bottom views showing conductive patterns of both surface and rear-surface, respectively, of the multi-layered printed circuit board.

The multi-layered printed circuit board 1 is conveyed on a conveyor belt means (11a, 11b) in the reflow furnace with its opposite edges sandwiched therebetween and comprises six copper foil layers L1 to L6 and insulating layers 2 each arranged adjacent the foil layers as shown in FIG. 3A. The respective copper foil layers L1 to L6 are equal to each other and the insulating layers 2 defined between the copper foil layers L1 and L6 are equal to each other. The copper foil layers L1 and L6, copper foil layers L2 and L5, and copper foil layers L3 and L4 provide a face-symmetry with respect to a middle plane of the multi-layered printed circuit board. The embodiment of the present invention will be explained below by taking the face-symmetry relation of the copper foil layers L1 and L6 by way of example.

Figure 3B:
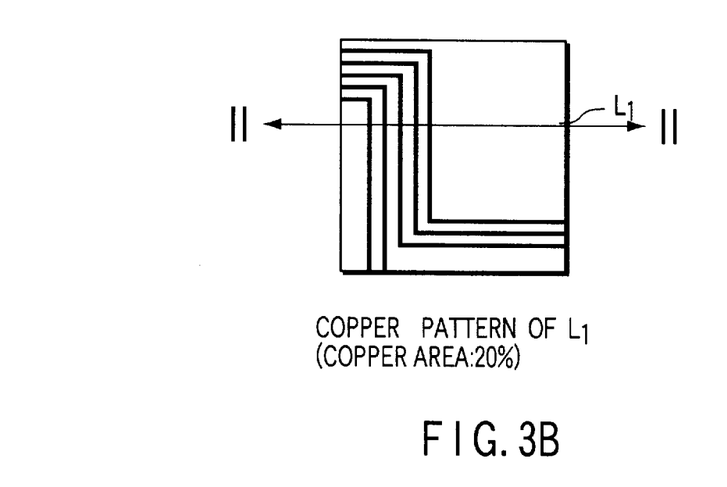
FIG. 3B is a plan view showing a conductive pattern of a surface layer of the interconnection board.

First, if the conductive pattern of the copper foil layer L1, being functionally formed based on an electric circuit, provides a five-line pattern with its five lines folded as shown in FIG. 3B for example. The copper foil pattern provides a 20% area rate with respect to the surface of the board.

Figure 3C:
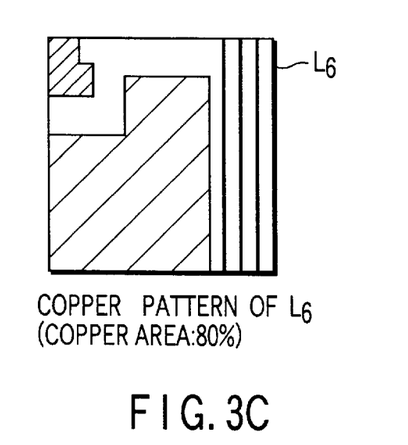
FIG. 3C is a plan view showing a conductive pattern on a rear surface layer of the interconnection board.

On the other hand, the copper foil layer L6, being similarly formed as a pattern, provides three lines and two pattern areas as shown in FIG. 3C for example. The copper foil pattern provides a 80% area rate with respect to the surface of the board.

In the state here shown, their mutual copper area provides a greater difference and a poor balance. The copper foil pattern arrays exist one-sidedly, that is, mainly on one side of the board surface, in both cases and their balances are broken. The copper foil layers L1 and L6 cause a stress difference resulting from their thermal expansions, thus producing a warp in a resultant multi-layered circuit board.

Then, if the balance processing is done on the copper foil layer L1 and a redundancy conductive pattern, such as a copper foil area increasing pattern, is formed on a right-half side of the copper foil layer L1 as shown in FIG. 2B, it provides a copper foil layer L1' whose whole copper foil pattern is increased to 60% as the area rate with respect to the board. There are the cases where the redundancy pattern at this time is so configured as a linear array or a polygon shape as to conform to a surrounding interconnection pattern. If, on the other hand, balance processing is done on the copper foil layer L6 by opening area reduction holes 5 in a left-half area section of the board as shown in FIG. 2C and, by doing so, achieving such an area reduction, it provides a layer L6' and an area ratio of the whole copper foil pattern with respect to the board surface is reduced to 60%.

As a result, the area rates of the copper foil patterns with respect to the board surface are set in a substantially counterbalanced state (60% VS 63%) and the thermal expansion coefficients of both the surfaces of the board are set in a balanced state to an extent to which a warp is produced at the board. And their mutual stresses involved are canceled, thus preventing a warp at the board.

Such balance processing are also performed on the remaining symmetrically-related copper foil layers L2 and L5, and L3 and L4, whereby it is possible to prevent a warp at the board.

Since the copper foil layers L1' and L6', L2' and L5', and L3' and L4' in the multi-layered printed circuit board 1 are set in a symmetrically-related position in a mutually-balanced way, a resultant multi-layered printed circuit board 1 is wholly balanced and, even if being subjected to heat in the reflow furnace, etc., the stresses involved are canceled and it is possible to suppress a warp at the printed circuit board to a minimal extent.

Needless to say, the above-mentioned balance processing is done in selected positions on the board, taking into consideration an adverse influence being exerted on the functions of an electric circuit means and magnetic shield even in the area increasing processing or area reduction processing.

Although, in the above-mentioned embodiment, the balance processing is done on the copper foil layers L1' to L6' in a symmetrical relation to the thickness direction, that is, the balance processing is done as the area increasing processing in the one phase and as the area reduction processing in another phase, if any balance is obtained in either one of these balance processing methods, it is not necessary to perform balanced processing in both cases.

Although, in the above-mentioned embodiment, an explanation has been given about the multi-layered printed circuit board, the present invention is applicable even to a double-sided printed interconnection circuit board with copper foil layers formed one at one surface side and one at the other surface (rear surface) side of an insulating layer because the symmetrical relation can be established in a thickness direction (said one surface and said rear surface).

By performing balanced processing emphatically on those paired more outwardly situated conductive layers it is possible to effectively suppress a warp even if the balance of copper foil layers of those paired more inwardly situated conductive layers are somewhat one-sided.

In the above-mentioned embodiment, although an even number of copper foil layers have been explained as being involved, even if use is made of an odd number of copper foil layers, it is possible to obtain substantially the same result as set out above if, relative to and except for a middle layer, the balance processing is effected on the remaining symmetry-related layers.

The above-mentioned processing, being briefly explained, is done as follows. If use is made of an interconnection board comprising conductive layers at least having an area-increasing area or areas in a non-linear or polygonal pattern and an insulating layer or layers alternately stacked in a manner to sandwich it or them with the conductive layers and having the amounts of conductive members varied in a predetermined range in their thickness direction of the stacked or layered interconnection board, their bending moments are well balanced on both surfaces of the interconnection board and it follows that a warp resulting from thermal deformation is less produced. Here the word "predetermined range" means an allowable variation range in which a warp is produced when a predetermined amount of heat is applied to the board. Such a predetermined range can be found either experimentally or through experiences.

There are sometimes the cases where the conductive members cannot be arranged equally in a symmetrical relation to the thickness direction of the board from the standpoint of a circuit layout. Such cases can be handled as will be set out below.

Figure 4:
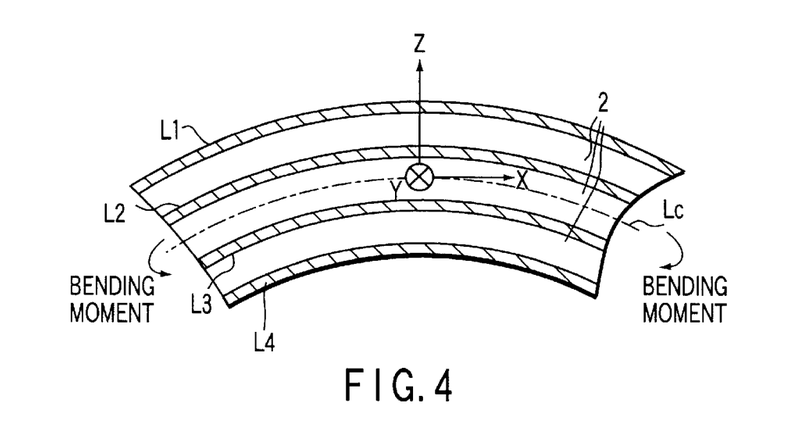
FIG. 4 is a cross-sectional view for explaining a control principle, showing a mechanical relation of a warped board.

FIG. 4 is a cross-sectional view showing a mechanical relation of a warped, printed circuit board, a model which explains an adjusting principle of the present invention. In this model, a printed circuit board 1 is comprised of four conductive layers made of copper, that is, first to fourth conductive layers L1 to L4 stacked with an insulating layer 2 formed adjacent the respective conductive layers. The conductive layers and insulating layers are numbered in an increasing number order. The model of FIG. 4, though being of a four-conductive-layer structure, is not restricted in number of layers to be stacked.

Now the bending moment under which a printed circuit board 1 (hereinafter referred to as the board) is warped with its opposite edges bent downward can be expressed by equation (1), noting that the bending moment denotes a value per unit length of its Y-axis direction. And the thermal stress denotes an X-direction component of a thermal stress.

$$[\text{bending moment}] = \int_{-(\text{board thickness}/2)}^{(\text{board thickness}/2)} [\text{thermal stress}] \cdot Z \cdot dZ, \quad (1)$$

provided that the Z-axis represents a reference axis (imaginary axis) L.C. parallel to a normal of the board and having a midpoint of the board in the thickness direction set as an origin. Generally, the rigidity of the conductive layers L1 to L4 is adequately greater than that of the insulating layer 2 and, with N as the number of conductive layers, the bending moment can be expressed by $$\sum_{i+1}^{N} \{[\text{elastic modulus of the } i\text{-th copper foil layer}] \times \quad (2)$$

$$[\text{linear expansion coefficient of the } i\text{-th copper foil layer}] \times$$

$$[\text{temperature variation}] \times$$

$$[\text{thickness of the } i\text{-th copper foil layer}] \times$$

$$[\text{Z-coordinate of a center of the } i\text{-th copper foil layer}]\}$$

If the area rate of a residual copper portion with respect to the surface area of the board is defined as a copper occupation rate, the elastic modulus and linear expansion coefficient of the conductive layer can be expressed as equations (3) and (4) and the Z coordinate 1 at the center of the first copper foil layer is expressed as equations (5-1) and (5-2).

$$[\text{elastic modulus of i-th copper foil layer}]=[\text{elastic modulus of copper}] \times \sqrt{[\text{i-th copper foil layer's copper occupation rate}]} \quad (3)$$

$$[\text{linear expansion coefficient of i-th copper foil layer}]=[\text{linear expansion coefficient of copper}] \times \sqrt{[\text{i-th copper foil layer's copper occupation rate}]} \quad (4)$$

<in case I=1>

$$[\text{Z-coordinate at a center of 1-th copper foil layer}]=\tfrac{1}{2}[(\text{board thickness}]-[\text{thickness of 1-st copper foil layer}] \quad (5\text{-}1)$$

<in case I=2 to N>

$$[\text{Z-coordinate at a center of 1-th copper foil layer}]=\tfrac{1}{2}[(\text{board thickness}]-[\text{thickness of i-th copper foil layer}])$$

$$-\sum_{k=1}^{i-1}([\text{thickness of } k\text{-th copper foil layer}] + \quad (5\text{-}2)$$

$$[\text{thickness of insulating layer between } (k+1)\text{-th}$$

$$\text{copper foil layer and } k\text{-th copper foil layer}])$$

Substituting the equations (3) and (4) into the equation (2) and rearranging them give an equation (6):

[bending moment]=[elastic modulus of copper]×[linear expansion coefficient of copper]×[temperature variation]

$$[\text{bending moment}] = [\text{elastic modulus of copper}] \times \quad (6)$$

$$[\text{linear expansion coefficient of copper}] \times$$

$$[\text{temperature variation}] \times \left[ \sum_{i+1}^{N} \right.$$

$$\{[\text{copper occupation rate of the } i\text{-th copper foil layer}] \times$$

$$[\text{thickness of the } i\text{-th copper foil layer}] \times$$

$$\left. [\text{Z-coordinate of a center of the } i\text{-th copper foil layer}]\} \right]$$

In the equation (6), the "bracketed" sigma (Σ) equation is defined as [a variation in amount of copper in a board thickness direction]. Thus, [a variation in amount of copper in a board thickness direction] can be expressed by the equation (7).

[variation in amount of copper in board-thickness direction]=

$$[\text{variation in amount of copper in board-thickness direction}] =$$

$$\sum_{i+1}^{N} \{[\text{copper occupation rate of the } i\text{-th copper foil layer}] \times$$

$$[\text{thickness of the } i\text{-th copper foil layer}] \times$$

$$[\text{Z-coordinate of a center of the } i\text{-th copper foil layer}]\}$$

The "bracketed" terms in equation (6), that is, the terms to the exclusion of equation (7), represent nonzero physical quantities. From this the following procedures were obtained, based on equation (7), for preventing a warp at the printed circuit board.

(A) In order to reduce a variation in amounts of copper in the board thickness direction, the bending moment is reduced by adjusting the copper occupation rate of the respective conductive layer, or the thicknesses of the respective conductive layers and respective insulating layers, or both the copper occupation rate and the thickness of these respective layers.

(B) The respective conductive layers and respective insulating layers in the board are stacked with their corresponding layer's thicknesses defined in a symmetric relation in a manner to have its middle layer set as a reference axis in the thickness direction of the board and, by setting the copper occupation rates of the symmetrically situated corresponding layers equal to each other, the "variation in amounts of copper in the board thickness direction" is brought closer to zero.

(C) In order to adjust the copper occupation rate of the respective conductive layer, use is made of area reduction holes or area increasing pattern areas.

Although the conductive members of the conductive layers have been explained as being copper, if the copper, copper foil layer and copper occupation rate are read as a conductive member, conductive layer and conductive member layout rate, respectively, a similar explanation can be given when use is made of other proper conductive materials. Since the procedure (C) has already been explained above, an explanation will be given in detail below about the other procedures (A) and (B).

In FIG. 3A is shown a multi-layered printed circuit board of 1 mm thick with the six conductive layers L1 to L6 formed, as conductive patterns, with the insulating layer 2 sandwiched between the adjacent conductive patterns. In this board, the respective conductive layers L1 to L6 are equal in thickness to each other and these sandwiched insulating layers are equal in thickness to each other and are 152 μm.

Thus, the conductive layers L1 and L6, L2 and L5, and L3 and L4 are face-symmetrical with respect to a reference plane as which a middle plane is defined in the thickness direction of the board. And the first to sixth conductive layers are stacked with the interposing insulating layer provided between the adjacent conductive layers.

The copper occupation rates of the respective conductive layers L1 to L6 formed as circuit patterns in accordance with a circuit design are as follows, noting that a "variation" in amounts of copper in the thickness direction is −6912 μm².

TABLE 1

Copper occupation rate profile before a
"variation" adjustment

| Conductive layer | Copper occupation rate (rate of residual conductive member on a layer) |
|---|---|
| 1st conductive layer | 0.60 |
| 2nd conductive layer | 0.70 |
| 3rd conductive layer | 0.80 |
| 4th conductive layer | 0.80 |
| 5-Th conductive layer | 0.80 |
| 6-Th conductive layer | 0.90 |

Figure 5A:
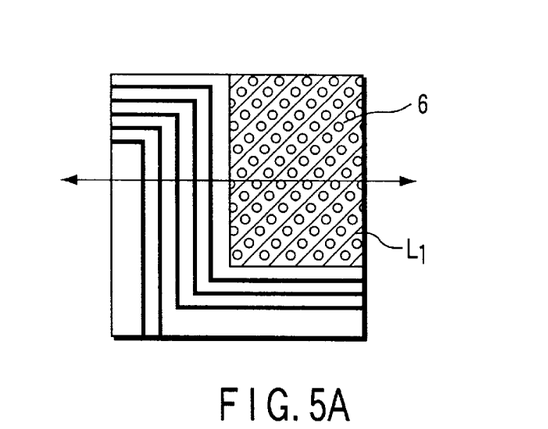
FIG. 5A is a plan view showing a board subjected to control processing in accordance with the present invention.
Figure 5B:
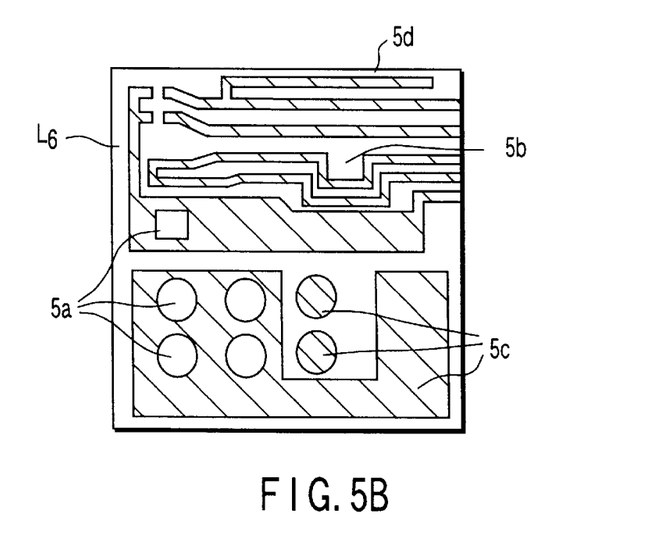
FIG. 5B is a plan view showing a board subjected to control processing in accordance with the present invention.

FIGS. 5A and 5B show results of adjustment processing made on the printed interconnection board in connection with a "variation in amounts of copper in the thickness direction". That is, FIG. 5A is a plan view showing the printed interconnection board on which the adjustment processing is made and FIG. 5B is a plan As shown in FIG. 5A, area-increasing copper pattern areas 6 are provided at a location free from the copper pattern of a first conductive layer L1 of the printed interconnection circuit board in a way to prevent any short-circuiting between the copper pattern portions. On a sixth conductive layer L6 symmetrically situated relative to the first conductive layer L1 in the thickness direction of the printed interconnection board, area adjustment processing is done by forming area reduction holes 5a of a properly settable configuration, forming a projection/recess area 5b as a kind of redundancy pattern partway on an interconnection pattern portion in a way positively free from any electrical function and forming copper patterns 5c, 5d as a kind of redundancy pattern at a copper pattern-free area irrespective of any conductive function of the conductive pattern as shown in FIG. 5B. By doing so, the copper occupation rate of the respective layers is adjusted. Adjustment processing can also be done by varying a full width, length, etc., of the interconnection pattern.

Table 2 below shows data on the copper occupation rate of the respective conductive layers after adjustment.

TABLE 2

| Conductive layer | Copper occupation rate profile after a "variation" adjustment |
|---|---|
| | Copper occupation rate (rate of residual conductive member on a layer) |
| 1st conductive layer | 0.91 |
| 2nd conductive layer | 0.70 |
| 3rd conductive layer | 0.80 |
| 4th conductive layer | 0.80 |
| 5-Th conductive layer | 0.80 |

TABLE 2-continued

| Conductive layer | Copper occupation rate profile after a "variation" adjustment |
|---|---|
| | Copper occupation rate (rate of residual conductive member on a layer) |
| 6-Th conductive layer | 0.85 |

As evident from Table 2, a "variation in amounts of copper in the thickness direction of the board" was of the order of 0 $\mu m^2$.

By doing so, it was possible to reduce the bending moment in the printed circuit board 1 and prevent a warp at the printed circuit board.

Although, in the above-mentioned embodiment, the printed circuit board 1 has been explained as having six conductive layers, it is not restricted to that number. And no particular restriction is made to the size and configuration of the printed circuit board 1. It is possible to freely select the number of such boards to be provided in one panel. The material of which the conductive layer is made is not restricted to copper or copper alloy.

Setting the absolute value of the "variation in amounts of copper in the board thickness" as $\epsilon$, it is preferable that $\epsilon$ be made as near to zero as possible, but it is not necessarily set to be zero. By experimentally chasing the value of $\epsilon$ in a way to correspond to an amount of warp at the warping of the board, it is possible to set $\epsilon$ to be an arbitrary value in accordance with an allowable warp amount range of the board. It is possible to more effectively suppress the warp at the board as $\epsilon$ goes nearer to zero. In the actual step of calculating the copper occupation rate, there arise an area readout error, "round-off" error, etc., and it is difficult to strictly set $\epsilon$ to be $\epsilon=0$ or to confirm it. It is preferable that the designer initially set the range of $\epsilon$, taking these problems into consideration.

As set out above, the interconnection board with the copper occupation rate of the conductive layers adjusted to prevent a warp caused by heat is provided as a circuit board after a semiconductor IC circuit, semiconductor memory, other electric components have been soldered past a reflow furnace, etc. Such a circuit board is used in various forms of assembly with a display device, such as a display or LED, for displaying an inner state of an electronic circuit, with an input component device, such as a microphone, various kinds of sensors or keypad, for inputting electronic information into the circuit board, and with an output device, such as a handheld telephone set, etc., a speaker, etc., for handling a sound, an electric heating wire and microwave generation circuit, for handling heat, and a rotation machine, linear motor, etc., for handling a motive power. These assembled units each are incorporated in a housing and, by doing so, many kinds of electric apparatuses are provided.

In the design concept of the conventional interconnection board, if there occurs a warp at the board, heavy members are attached to both opposite edge portions of the board as shown in FIG. 8 so as to raise the rigidity of the board as a whole. By doing so, a warp at the board is suppressed. In the case where any electric apparatus is fabricated with the use of the circuit board above, there is a risk that, after being assembled into the device, the board will be warped due to the evolution of heat in the electric apparatus per se. This problem is becoming more prominent in a more compact lightweight handheldable apparatus, such as a handheld telephone set, handheld computer and handheld information terminal device such as an electronic organizer.

According to the interconnection board of the present invention, specific attention is paid to a difference in expansion extent between the conductive layers resulting from a difference in their copper occupation rates and the expansion extents in the conductive layers are so balanced as to produce no warp there. By doing so, the generation of the bending moment is suppressed and no warp is produced at the board. It is thus possible to use the interconnection board of the present invention without the need to take any specific means against heat in a current downsizing/lightweight trend to a radio unit, in particular, to a handheld information terminal apparatus. The electric apparatus using such an interconnection board is less likely to produce a fault resulting from the evolution of heat.

The actual application of the present invention's interconnection board to the handheld telephone set will be explained below.

Figure 6A:
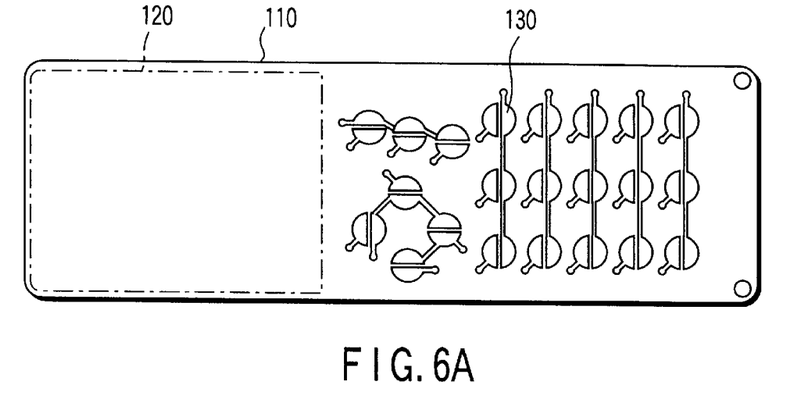
FIG. 6A is a model view showing a board of a conventional hand-held telephone set.

FIG. 6A shows one form of a pattern on a surface foil copper layer on a key-mounting side of an interconnection board of a conventional handheld information terminal. The key corresponds to a button for inputting digital information, that is, a button corresponding to a telephone number in a telephone set. Wires for an audio circuit, display circuit, etc., are provided in a section where no keys are mounted on the interconnection board 110, that is, a section as indicated by a broken line in FIG. 6A. The wires 130 for keypads corresponding to the keys are provided at those areas corresponding to the keys to be depressed. In this kind of conventional interconnection board, a copper occupation rate of the key-mounting section is relatively low. That is, both key depression state sensing wires corresponding to the key pads and relay wires (wires taking electric signals from the sensing wires) are usually simply provided in the interconnection board at those areas of the keypad wires 130. There are almost no other wires present at the board surface side and the copper-free area in that case is relatively wider than the copper-present area at the board. This is understable from the copper occupation rate of the conventional interconnection board in Table 3 below, showing that the conductivity of a first conductive layer is prominently lower than other conductive layers.

TABLE 3

Interconnection board of handheld telephone set

| Conductive layer | Copper occupation rate (rate of residual conductive member on a layer) |
|---|---|
| 1st conductive layer | 0.5522 |
| 2nd conductive layer | 0.5139 |
| 3rd conductive layer | 0.8521 |
| 4th conductive layer | 0.6451 |
| 5-Th conductive layer | 0.6398 |

TABLE 3-continued

Interconnection board of handheld telephone set

| Conductive layer | Copper occupation rate (rate of residual conductive member on a layer) |
|---|---|
| 6-Th conductive layer | 0.7178 |

Figure 6B:
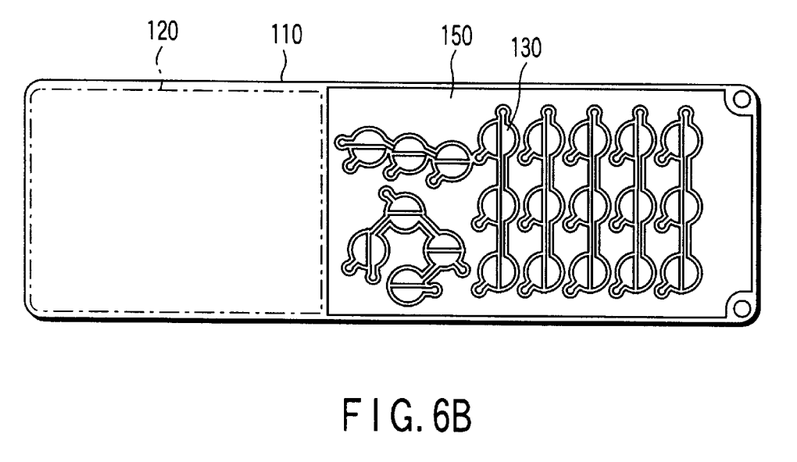
FIG. 6B is a model view showing a board of a hand-held telephone set which has been subjected to control processing.
Figure 6C:
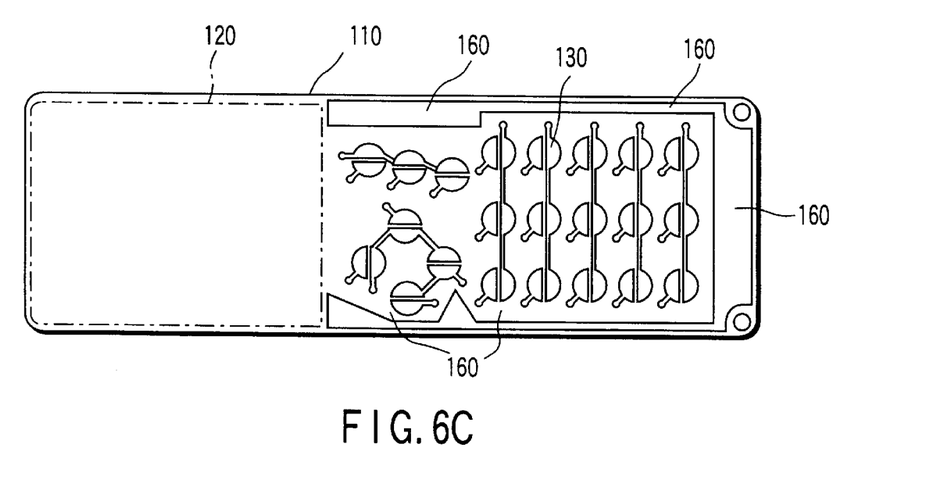
FIG. 6C is a model view showing a board of a hand-held telephone set which has been subjected to control processing.

The interconnection board comprising six conductive layers in Table 3 is of such a type that the respective copper foil layers are 18 $\mu$m thick and respective insulating layers 10 $\mu$m thick. At this time, the "variation in amounts of copper in the board thickness direction" is 1061 $\mu m^2$. FIG. 6B shows a pattern of a surface copper foil layer at a key mounting side on the interconnection board of the handheld information terminal which is fabricated according to the present invention. A GND section 150 having those portions complementary to the keypad wires is formed as a redundancy pattern, noting that the GND section 150 constitutes a conductive member for taking a ground potential for an electric circuit. The GND section 150 is so formed as to have those portions surrounding the keypad wires, not bordering on the keypad wires. And the copper occupation rate of the first conductive layer in Table 3 is adjusted by adjusting the area of the GND line 150. Since an interconnection pattern of a conductive member has only to be formed at a section in a manner to be buried between the surrounding edge of the interconnection board and the keypad wires, a pattern 160 as shown in FIG. 6C may be provided in place of an accurate complementary uneven pattern configuration. Further, the interconnection pattern 160 is not required to be the GND section.

By increasing the occupation area of the GND line 150 in a range not contacted with the copper pattern such as the keypad wires 130, the copper foil layer (first conductive layer in Table 3) has its copper occupation rate made to be 0.7520 and hence a variation in amount of copper in the board thickness direction is made nearer to zero. As a result, the bending moment on the board is reduced and it was possible to prevent a warp at the interconnection board produced in a reflow process and to eliminate the cause for a fault generation in an apparatus with the board incorporated therein. Needless to say, the same result is also obtained by making the layout area of the keypad wires per se greater. By adjusting the residual copper layer by the GND line the area of the GND line becomes greater and free electrons can be supplied with a margin. It is also possible to suppress the generation of heat resulting from the shortage of free electrons.

Although, according to the interconnection board of the present invention, the copper occupation rate has been explained as being adjusted by providing the ground section (GND section) so as to surround the keyboard wires, it is possible to adjust the copper occupation rate by, instead of providing any such GND section, providing those wires for other circuits, such as a copper foil pattern not conductive to the electrical circuit and wires for a display circuit and for a speech output circuit. By forming a GND section and other circuit wires in a way to narrow those portions between the keypad wires or by forming a pattern of a conductive member not conductive to an electric circuit, it is possible to readily suppress a variation of the conductive member or members in a board thickness direction. Since the conductive layer with wires provided for receiving inputs from buttons is much lower in layout rate (copper occupation rate) than other conductive layer or layers, it is possible to obtain the advantage of reducing a warp simply by providing a conductive pattern so as to further increase the layout area of the conductive member at those sites with the wires provided for receiving the inputs of the buttons. Further, reducing a warp by adjusting the layout rate of more outwardly positioned conductive layer portion saves more absolute quantity of a conductive material to be controlled, so that it is possible to obtain a readier positional adjustment. It is to be noted that, if a conductive pattern is buried in a whole empty space, the layout area of the conductive member becomes too much. In this case it is preferable that the pattern be formed to have the value of the equation (7) brought closer to zero.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A multi-layered substrate comprising:
   at least one first layer having at least one portion of a conductive member having a layout area increased by a redundancy pattern; and
   a second layer including an insulating member so provided as to be stacked adjacent to said at least one first layer in an alternate way, which constitutes a board together with the at least one first layer, wherein
   a variation in amount of said conductive member relative to the first layer is set within a predetermined range on each side with reference to a middle of the board in a board thickness direction, and
   a value of $$\sum_{i+1}^{N} \{[\text{layout rate of a conductive member in an } i\text{-th conductive layer}] \times$$
$$[i\text{-th conductive layer thickness}] \times$$
$$[Z\text{-coordinate of a center of the } i\text{-th conductive layer}]\}$$

being almost zero, where
   the layout rate of the conductive member: a rate of an area of the conductive member in an area of the substrate surface;
   N: the number of conductive members; and
   a Z-axis: an axis parallel to a board thickness direction with a center of the substrate as an origin.

2. The multi-layered substrate according to claim 1, wherein said conductive member has an area reduction hole.

3. The multi-layered substrate according to claim 1, wherein the conduction layer has an area increasing pattern of a conductive member.

4. The multi-layered substrate according to claim 1, wherein said conductive member is formed of copper or copper alloy.

5. The multi-layered substrate according to claim 1, wherein the redundancy pattern is formed of a conductive member of a winding or elbow-shaped or polygon configuration.

6. A method for manufacturing a multi-layered substrate including a step of:
   alternately stacking conductive layers with an insulating layer therebetween, the conductive layer having at least one portion of a conductive member arranged in a nonlinear or polygonal configuration and having a greater layout area, the method comprising the step of stacking conductive layers, wherein a variation in amount of said conductive member with a middle of a substrate thickness direction as a reference is set in a predetermined range
   wherein said conductive layers are formed in such a way that a value of $$\sum_{i+1}^{N} \{[\text{layout rate of a conductive member in an } i\text{-th conductive layer}] \times$$
$$[i\text{-th conductive layer thickness}] \times$$
$$[Z\text{-coordinate of a center of the } i\text{-th conductive layer}]\}$$

being almost zero, where
   the layout rate of the conductive member: a rate of an area of the conductive member in an area of the substrate surface;
   N: the number of conductive members; and
   a Z-axis: an axis parallel to a substrate thickness direction with a center of the substrate as an origin.

7. The method according to claim 6, wherein said conductive member includes an area reduction hole.

8. The method according to claim 6, wherein the conductive layer includes an area increasing pattern of a conductive member.

9. The method according to claim 6, wherein the conductive member is comprised of copper or copper alloy.

10. A method for manufacturing a multi-layered substrate comprising:
    alternately stacking conductive layers with an insulating layer therebetween, the conductive layer having at least one portion of a conductive member arranged in a nonlinear or polygonal configuration and having a greater layout area, the method comprising the step of stacking conductive layers, wherein a variation in amount of said conductive member with a middle of a substrate thickness direction as a reference is set in a predetermined range,
    wherein said conductive layers are formed in such a way that a value of $$\sum_{i+1}^{N} \{[\text{layout rate of a conductive member in an } i\text{-th conductive layer}] \times$$
$$[i\text{-th conductive layer thickness}] \times$$
$$[Z\text{-coordinate of a center of the } i\text{-th conductive layer}]\}$$

being almost zero, where
    the layout rate of the conductive member: a rate of an area of the conductive member in an area of the substrate surface;
    N: the number of conductive members; and
    a Z-axis: an axis parallel to a substrate thickness direction with a center of the substrate as an origin; and
    forming a conductive layer equal in area to a given another conductive layer situated in a symmetric position in a substrate thickness direction.

11. The method according to claim 10, wherein the conductive layer has an area reduction hole.

12. The method according to claim 10, wherein the conductive layer has an area increasing pattern formed of a conductive member.

13. The method according to claim 10, wherein the conductive layer is formed of copper or copper alloy.

14. An electric apparatus comprising:
   a multi-layered substrate, comprising:
      at least one first layer having at least one portion of a conductive member having a layout area increased by a redundancy pattern, and
      a second layer including an insulating member so provided as to be stacked adjacent to said at least one first layer in an alternate way, which constitutes a board together with the at least one first layer, wherein
      a variation in amount of said conductive member relative to the first layer is set within a predetermined range on each side with reference to a middle of the board in a board thickness direction; and
      a housing for holding the multi-layered substrate wherein a value of $$\sum_{i+1}^{N}([\text{layout rate of a conductive member in an } i\text{-th conductive layer}] \times [i\text{-th conductive layer thickness}] \times [\text{Z-coordinate of a center of the } i\text{-th conductive layer}])$$

is set at almost zero, where
      the layout rate of the conductive member: a rate of an area of the conductive member in an area of the board surface;
      N: the number of conductive members; and
      a Z-axis: an axis parallel to a board thickness direction with a center of the board as an origin.

15. An electric apparatus comprising:
   a multi-layered substrate with occupation rates of conductive members of given conductive layers being substantially equal in a symmetric position in a thickness direction; and
   a housing for holding the multi-layered substrate.

16. An electric apparatus comprising;
   a button for receiving information;
   a circuit board having a multi-layer substrate, said substrate comprising:
      at least one first layer having at least one portion of a conductive member having a layout area increased by a redundancy pattern; and
      a second layer including an insulating member so provided as to be stacked adjacent to said at least one first layer in an alternate way, wherein
         a variation in amount of said conductive member relative to the first layer is set within a predetermined range on each side with reference to a middle of the board in a board thickness direction; and
      displaying means for displaying information processed by the function of the circuit board, wherein a value of $$\sum_{i+1}^{N}([\text{layout rate of a conductive member in an } i\text{-th conductive layer}] \times [i\text{-th conductive layer thickness}] \times [\text{Z-coordinate of a center of the } i\text{-th conductive layer}])$$

is set at almost zero and an interconnection pattern of a conductive member is formed between an edge portion and an interconnection pattern for receiving an input from the bottom.

17. An electric apparatus comprising:
   a button for inputting information;
   a circuit board having a multi-layered substrate; and
   display means for displaying information processed by the function of the circuit board, wherein
   the multi-layered substrate is such that an interconnection pattern has conductive layers equal in area to each other in a symmetric position in a board thickness direction and comprised of a conductive member between an edge portion and an interconnection layer for receiving an input from the button.

18. An electric apparatus comprising:
   a multi-layered substrate, comprising:
      at least one first layer having at least one portion of a conductive member having a layout area increased by a redundancy pattern, and
      a second layer including an insulating member so provided as to be stacked adjacent to said at least one first layer in an alternate way, which constitutes a board together with the at least one first layer, wherein
      a variation in amount of said conductive member relative to the first layer is set within a predetermined range on each side with reference to a middle of the board in a board thickness direction; and
      a housing for holding the multi-layered substrate, wherein the multi-layered substrate has at least one conductive layer arranged in a nonlinear or polygonal configuration and at least having a redundancy pattern and an insulating layer providing an alternate array relative to the conductive layer wherein:
         a variation in amount of said conductive member relative to the conductive layer with a middle of a board thickness direction as a reference is set in a range in which a warp is less likely to be produced, and
         a value of $$\sum_{i+1}^{N}([\text{layout rate of a conductive member in an } i\text{-th conductive layer}] \times [i\text{-th conductive layer thickness}] \times [\text{Z-coordinate of a center of the } i\text{-th conductive layer}])$$

is set at almost zero, where
         the layout rate of the conductive member: a rate of an area of the conductive member in an area of the board surface;
         N: the number of conductive members; and
         a Z-axis: an axis parallel to a board thickness direction with a center of the board as an origin.

19. An electric apparatus comprising:
   button means for inputting information;
   a circuit board having a multi-layered substrate, said substrate comprising:

at least one first layer having at least one portion of conductive member having a layout area increased by a redundancy pattern; and a second layer including insulating member so provided as to be stacked adjacent to said at least one first layer in an alternate way, which constitutes a board together with the at least one first layer, wherein a variation in amount of said conductive member relative to the first layer is set within a predetermined range on each side with reference to a middle of the board in a board thickness direction; and display means for displaying information processed by the function of the circuit board, wherein:

a value of $$\sum_{i+1}^{N} ([\text{layout rate of a conductive member in an } i\text{-th conductive layer}] \times [i\text{-th conductive layer thickness}] \times [Z\text{-coordinate of a center of the } i\text{-th conductive layer}])$$

is set at almost zero and an interconnection pattern of a conductive member is formed between an edge portion and an interconnection pattern for receiving an input from the bottom the multi-layered substrate comprises at least one conductive layer having a nonlinear or polygonal configuration and at least a portion of a conductive member having a redundancy pattern and an insulating layer providing an alternate array relative to the conductive layer, the conductive layer is such that a variation in amount of the conductive member in the board thickness direction with a center of the thickness of the multi-layered substrate as a reference is set in a predetermined range, and an interconnection pattern of the conductive member is formed between an edge portion and an interconnection layer for receiving an input from the button means.

* * * * *